United States Patent [19]

Eubank et al.

[11] 4,140,964
[45] Feb. 20, 1979

[54] HIGH VOLTAGE BREAKDOWN TEST CIRCUIT FOR INSULATION TESTING UTILIZING A PREDETERMINED FIXED AMOUNT OF ENERGY

[75] Inventors: Carol H. Eubank, Greenwood; Carroll D. Hays; Noble E. Wickliff, both of Indianapolis, all of Ind.

[73] Assignee: Bell Telephone Laboratories, Incorporated, Murray Hill, N.J.

[21] Appl. No.: 760,335

[22] Filed: Jan. 18, 1977

[51] Int. Cl.² .......................................... G01R 31/14
[52] U.S. Cl. ................................. 324/54; 324/60 CD
[58] Field of Search ...................... 324/51, 52, 54, 55, 324/60 CD, 111, 96

[56] References Cited

U.S. PATENT DOCUMENTS

| | | | |
|---|---|---|---|
| 2,249,157 | 7/1941 | Morgan et al. | 324/55 |
| 2,310,335 | 2/1943 | Wolfson | 324/54 X |
| 2,436,615 | 2/1948 | Stearns | 324/54 |
| 2,594,595 | 4/1952 | Stearns | 324/54 X |
| 2,932,791 | 4/1960 | Carrington | 324/54 X |
| 3,005,150 | 10/1961 | Behr | 324/54 |
| 3,211,998 | 10/1965 | Kidwell | 324/54 |
| 3,319,157 | 5/1967 | York | 324/1 |
| 3,339,136 | 8/1967 | Rasor et al. | 324/54 |
| 3,436,648 | 4/1969 | Kim | 324/60 CD X |
| 3,510,763 | 5/1970 | Clinton | 324/54 |
| 3,614,605 | 10/1971 | Eisele | 324/54 |
| 3,742,346 | 6/1973 | Specht | 324/51 X |
| 3,866,117 | 2/1975 | Erdman | 324/54 |

Primary Examiner—Gerard R. Strecker
Attorney, Agent, or Firm—S. R. Williamson

[57] ABSTRACT

A high voltage breakdown test circuit for testing of insulation resistance within an electrical device is disclosed. Operator safety is attained by allowing a fixed amount of energy considered nonlethal and advantageously imperceptible into the test circuit and by the internal system design. The system elements are connected in series and must all function properly in order to deliver the output signal to the device under test. Each system element obtains its power from the fixed energy input and is thereby activated only during an actual test. Indicator means of the pass/fail type provide an operator with a quick visual indication of the results of an insulation resistance test.

15 Claims, 5 Drawing Figures

HIGH VOLTAGE BREAKDOWN TEST CIRCUIT FOR INSULATION TESTING UTILIZING A PREDETERMINED FIXED AMOUNT OF ENERGY

BACKGROUND OF THE INVENTION

This invention relates to the breakdown testing of electrical devices, and in particular, to the testing of telephone sets and telephone set components for electrical insulation breakdown resistance.

DESCRIPTION OF THE PRIOR ART

Exposed conducting surfaces of an electrical device have the potential of becoming lethal shock hazards or can cause less severe damage such as effecting a muscle spasm in the person touching the exposed surface. This danger of electrical devices having short circuits or material leakage between their internal circuits and outer enclosures is well known. As a result, safety standards throughout industry have been instituted to protect against possible shock hazards in an electrical device. Similarly, safety standards within the Bell System require the testing of telephone sets and the like for insulation breakdown resistance before they are provided to the customer to insure user safety.

Several voltage breakdown testers have heretofore been devised to test for short circuits and leakage currents. Some testers in the prior art involve the use of measuring instruments to determine whether the device under test is within an acceptable range. Unfortunately, the use of these test instruments always requires technical personnel experienced with the operation of the test equipment, insofar as interpreting the reading provided by the measuring instrument to determine if the device under test falls within the acceptable range.

Operator safety has always been an important consideration in the design of breakdown testers because of the potential shock hazard presented to the operator while using these testers to perform the short circuit and leakage current tests. In providing for operator safety, the testers designed most often in the prior art, use line power (110 volts at 60 Hz) transformed to the high voltage test signal that is applied directly to the electrical device under test. Outboard auxiliary sensing circuitry is relied upon to detect dangerous surges of current and quickly squelch the output voltage. However, in a tester of this design, the possibility of circuit faults or component failure that may allow dangerous currents to flow is significant. To reduce this possibility, on some testers, redundant control circuitry is added. Therefore, if one circuit fails, the remaining circuit must be relied upon to provide the required protection for the operator.

Another kind of protective circuit in the prior art employs physical barriers and interlocks that prevent the operator from coming in contact with the device under test and the dangerous voltage associated therewith during the test period. This type of test device, although effective in isolating the dangerous voltages from the operator, involves a time consuming procedure substantially increasing the effort necessary for the testing of each electrical device. Furthermore, where there are production pressures in manufacturing facilities, these physical barriers and interlocks are most often eliminated.

Thus, it is an object of this invention to provide a safe, simple to use, yet effective, high voltage breakdown test circuit without the above-described disadvantages.

SUMMARY OF THE INVENTION

In accomplishing these and other objects and in accordance with the invention, a high voltage breakdown test circuit is herein disclosed. Safety is inherent in a system designed in accordance with the present invention and is achieved by allowing only a fixed amount of energy considered to be nonlethal into the test circuit. In fact, the actual energy level dissipated by this test circuit when a person is in the discharge path is not only far below a dangerous value, it is also below the perception level of most people. Operator safety is obtained therefore strictly through the electronic system design, eliminating the need for physical barriers and interlocks to provide the required protection.

The high voltage breakdown test circuit is designed so that a number of system elements are connected in series and must all function properly in order to deliver the output signal consisting of six cycles of a high level, alternating voltage to the device under test. Each system element obtains its power from the fixed energy input and is thereby activated only during an actual test, further adding to the safety of the circuit design. Moreover, since the normal failure mode of each of the several components is open circuit, the likelihood that all of the serial components will fail "short" at the same time is extremely remote.

Indicator means of the pass/fail type are incorporated into this circuit design. Lamps that illuminate in accordance with the conditions of whether the equipment under test is within an acceptable range or not are utilized, enabling an operator not familiar with the internal circuitry of the test circuit to conduct meaningful tests.

Additional electronic protection in the form of a current detector is included to quickly sense an excess of current flow at the output of the test circuit and electrically squelch the signal voltage. The current detector will also activate a fail indicator which informs the operator of a defect in the device under test. Ultrasensitive fuses responsive to the product of current and time are in critical leads to sense any overflow of current within the test circuit, as well as that at the output of the test circuit. A failure of one of the several system elements that will allow over-currents to flow long enough will open one of the fuses which eliminates the signal voltage from the output. An open fuse will prevent both pass and fail indicators from being activated thereby informing the operator that the test circuit is defective.

To further inhibit the operator from making invalid tests if some of the internal circuitry fails, a voltage detector is used to determine if the test voltage is present at the output of the tester. By sensing the signal at the output, the voltage detector activates a pass indicator unless a fail signal is also present at the fail indicator. In this case, only the fail indicator will be activated.

Parasitic capacitances and parasitic voltages that might be present and impose a hazard to the operator are substantially reduced by completely isolating the test circuitry from the test chassis, power source and output display systems during the test period in this circuit design. By designing the current detector such that it has a low impedance input, sensitivity to electromagnetic pickup is also reduced. Additional noise protection for the test circuit is provided by requiring two over-current spikes during the six cycle test period to activate the fail circuit, although quick shutdown protection operates on all over-current spikes and squelches the voltage for the remaining portion of the half cycle on which it is triggered.

BRIEF DESCRIPTION OF THE DRAWING

The invention and its mode of operation will be more clearly understood from the following detailed description when read with the appended drawings in which:

FIG. 5 illustrates the arrangement of FIGS. 2 through 4.

DETAILED DESCRIPTION

Figure 1:
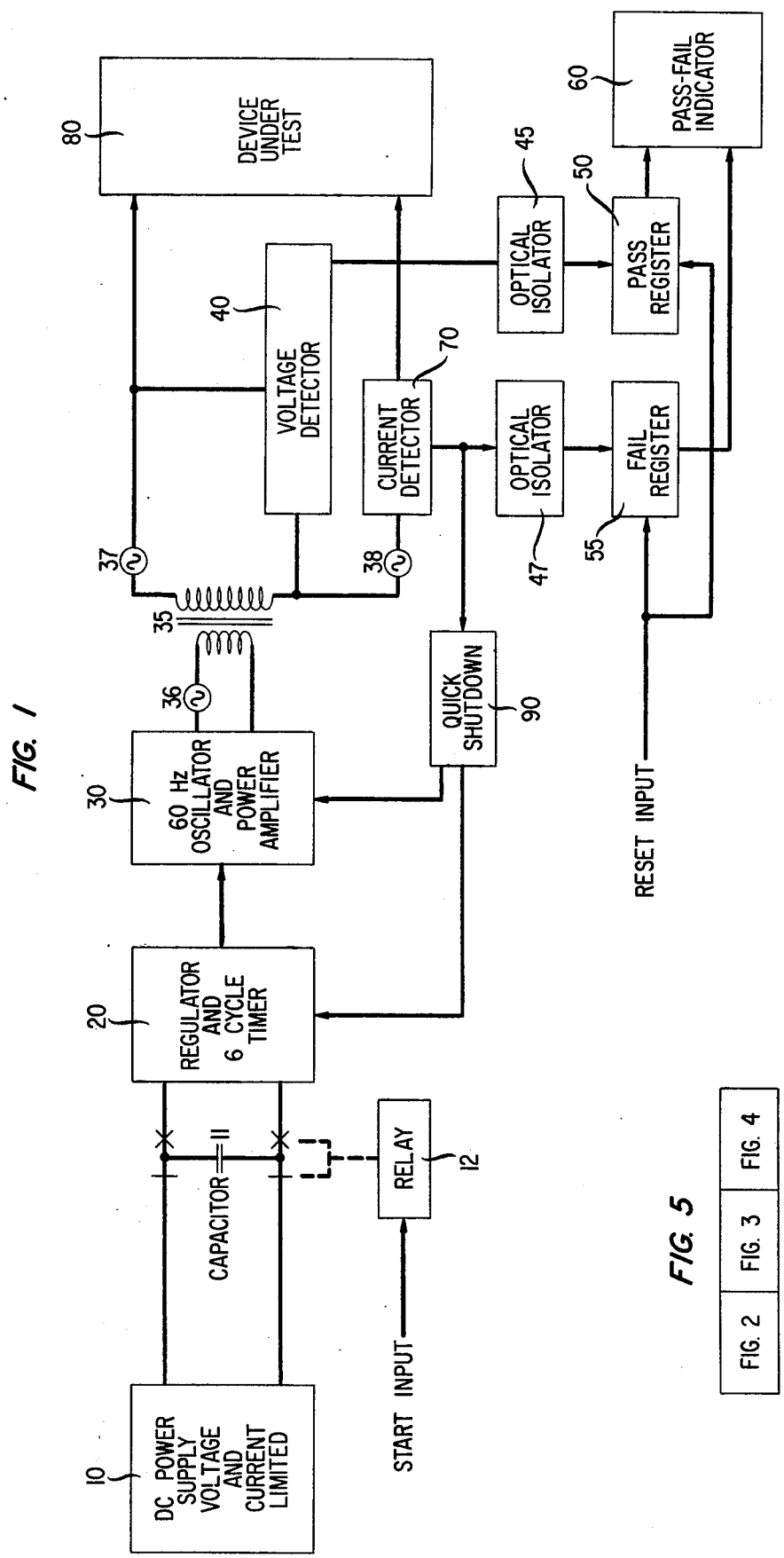
FIG. 1 is a block diagram illustrating the major functional components including a high voltage breakdown test circuit which embodies the principles of the present invention.

Referring now to FIG. 1, there is shown a functional block diagram of a specific illustrative high voltage breakdown test circuit. The arrangement comprises a safe low voltage d.c. power supply 10 that charges an energy storage means, capacitor 11, during the quiescent state of the tester to the desired energy level. A start input that begins the test cycle activates a relay 12, transferring the charge on capacitor 11 to an internal voltage regulator and 6-cycle timer 20. The internal circuitry of the tester is isolated from the power supply 10 during a high voltage breakdown test by the break contacts of relay 12 thereby limiting the amount of energy input into the tester to that stored by the capacitor.

Within the regulator and 6-cycle timer 20 is a circuit which develops a supply voltage consisting of dual regulated voltage levels to power the internal circuits of the tester for the test cycle. Also found within the regulator and 6-cycle timer 20 is a timer circuit which limits the test cycle by controlling the period in which supply voltage is delivered to the other circuits within the tester. Adjusted for a period of 100 milliseconds, the timer circuit 20 allows approximately 6 cycles of 60 Hz a.c. voltage to be generated by a 60 Hz oscillator and power amplifier circuit 30, before removing the supply voltage. The low level 60 Hz signal produced by the oscillator is next boosted by a power amplifier found within the 60 Hz oscillator and power amplifier circuit 30. The amplified signal is then applied to a step-up transformer 35. Both the primary and secondary circuits of the transformer 35 are fused at low values to protect against significant over-currents. Fuses 36, 37 and 38 open in a few microseconds when significant over-currents are present.

When voltage is present at the output of the tester, an optical isolator 45 transmits a logic pulse from a voltage detector 40 to a pass register 50 where it is stored. The output of pass register 50 will activate a pass indicator on a pass/fail indicator 60, indicating a valid test of an electrically operated device 80 unless a current detector 70 also senses an excess of current flow. In such a case, the current detector 70 is designed to transmit a signal to a quick shutdown circuit 90 which, in turn, shutsdown the 60 Hz oscillator and terminates the test cycle.

The same signal produced by the current detector 70 is also transmitted through an optical isolator 47 to a fail register 55 where it is stored. The signals from both the pass register 50 and fail register 55 go on to the pass/fail indicator 60 to be displayed. But, if both are present, the pass/fail indicator 60 is designed such that only the fail indicator will be activated. Before another device can be tested, or the same device tested again, the pass and fail registers must be cleared of any previously stored information by activating a reset switch.

Figure 2:
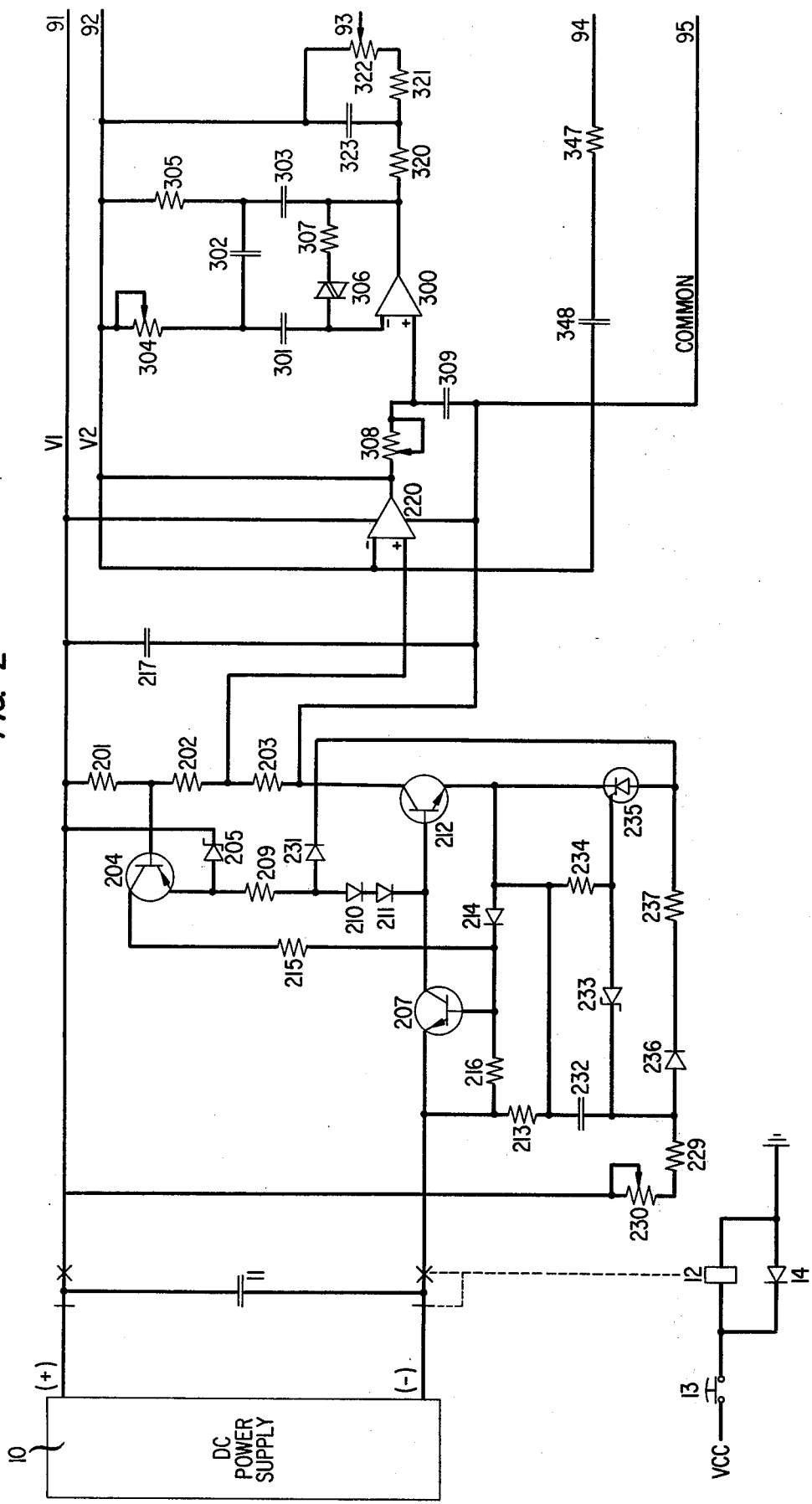
FIGS. 2 through 4 depict a schematic diagram of an illustrative high voltage breakdown test circuit and disclose in particular detail the circuitry associated with the block diagram illustrated in FIG. 1.
Figure 3:
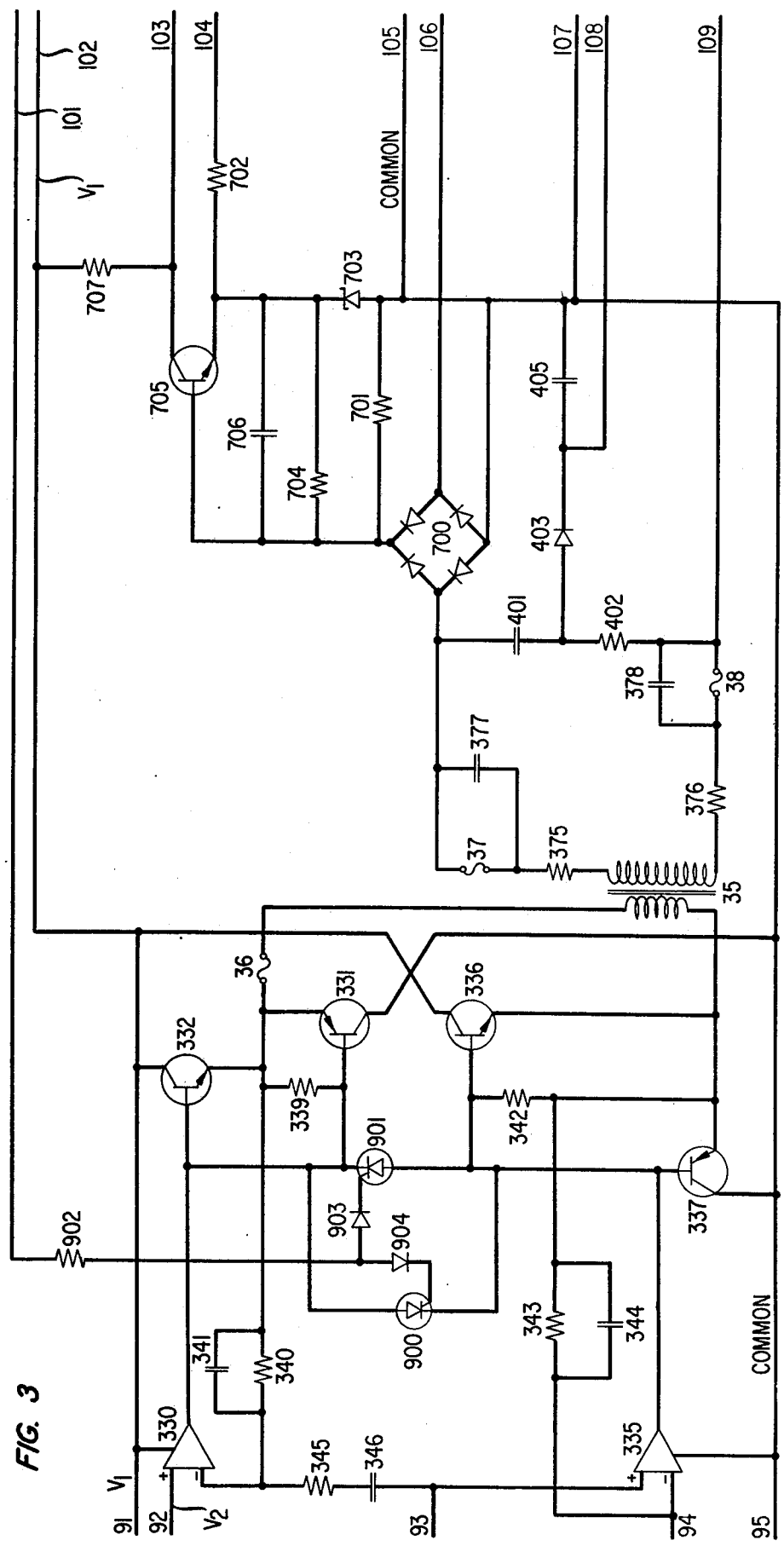
Figure 4:
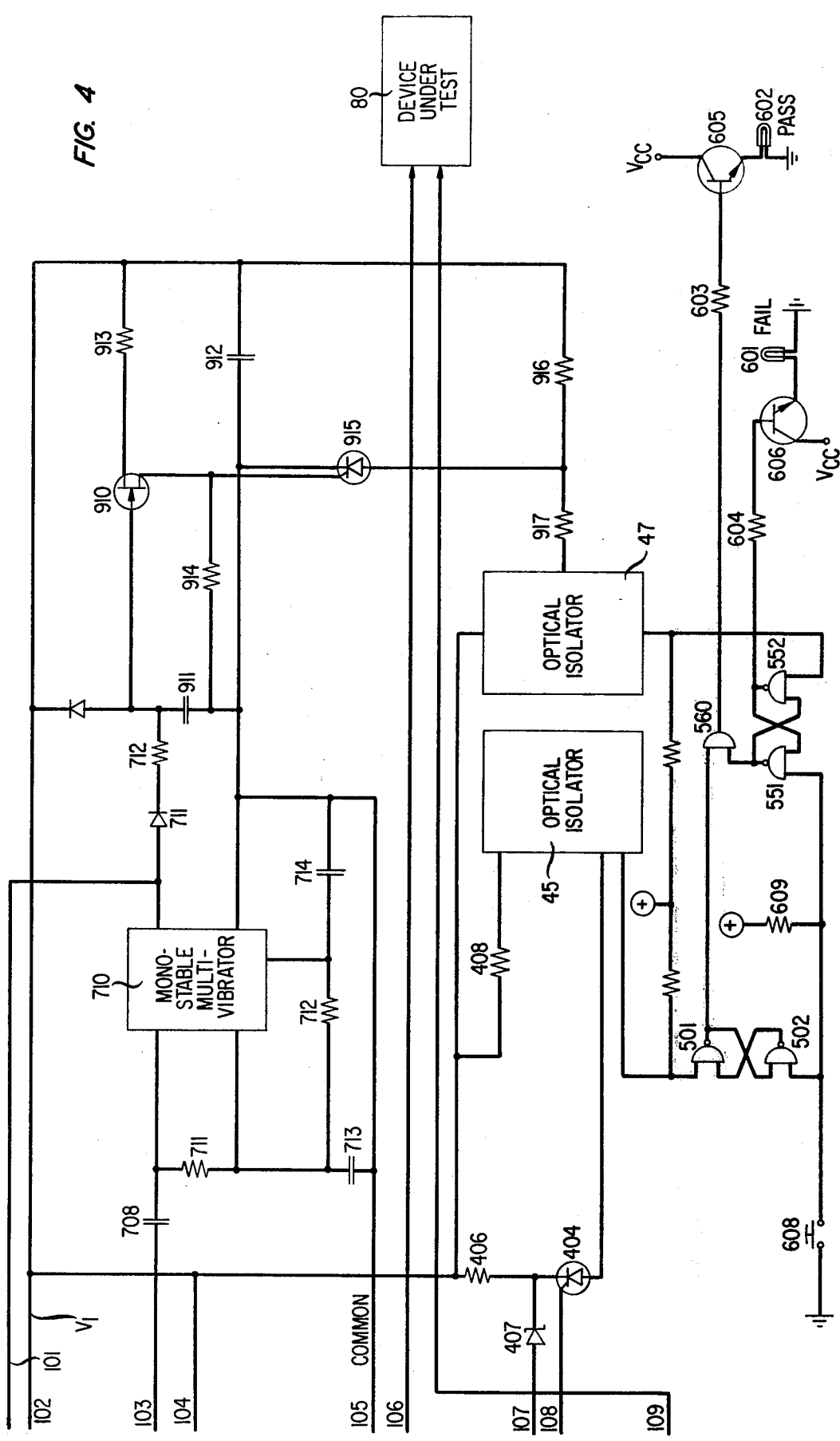

The individual high voltage breakdown test circuit sections are more thoroughly understood by reference to FIGS. 2, 3 and 4. FIGS. 2 through 4 depict a schematic diagram of an illustrative high voltage breakdown test circuit and disclose in particular detail the circuitry associated with the block diagram illustrated in FIG. 1. Throughout the schematic diagram in FIGS. 2 through 4, the components found within each test circuit sections of FIG. 1 are designated by reference numerals in the hundreds having the same initial digit as that block. For example, the components within the regulator and 6-cycle timer circuit 20 will have reference numerals 200 through 299.

With reference to FIG. 2, there is shown the d.c. power supply 10 which provides the energy to charge capacitor 11 to the desired d.c. potential through two normally closed contacts of relay 12. These two contacts open and two other normally open contacts close simultaneously, connecting the charged capacitor 11 to the internal circuitry when a start switch 13 is depressed activating relay 12. A diode 14 limits the voltage across the coil of relay 12 when switch 13 is released.

In order to drive the internal circuitry of the breakdown tester, two voltage levels $V_1$ and $V_2$ are necessary and are obtained within a voltage regulator section. Resistors 201, 202 and 203 make up a voltage divider network which allows transistor 204 to operate at a voltage much lower than that of voltage $V_1$. Reference diode 205 along with the voltage divider network provide the means for detecting a change in the magnitude of the output voltage. This error signal that is generated is then used in returning the output voltage to the desired level.

If an increase in the output voltage $V_1$ occurs, the voltage drop across resistor 201 also increases, causing the potential across the base of transistor 204 to become more negative. This in turn tends to turn transistor 204 on harder, drawing more current from diode 205 through transistor 204. When transistor 204 is conducting, a voltage divider network consisting of resistors 215 and 216 develops a positive potential, causing transistor 207 to conduct. This decreases the positive potential coupled through resistor 209, diodes 210 and 211 to the collector of transistor 207. By decreasing this positive potential the base of transistor 212 also becomes more negative, decreasing the output current. This consequently decreases the output voltage of the regulator section and returns the voltage drop across resistor 201 to that of diode 205.

A drop in the output voltage level of $V_1$ decreases the voltage drop across resistor 201 and causes the potential across the base of transistor 204 to become more positive. This tends to turn transistor 204 off and reduces the current flowing from diode 205 through transistor 204. The effect is to tend to turn off transistor 207 also and to increase the positive potential coupled to transistor 212 through resistor 209, diodes 210 and 211. The base of transistor 212 thus becomes more positive, increasing the output current. This consequently increases the output voltage $V_1$ and returns the voltage drop across resistor 201 to that of diode 205.

Transistor 207 also functions as a current-limiting transistor to protect the circuit from shorts or other unusual current demands. If a high current demand is present at the output of the regulator circuit, the current flowing from the emitter of transistor 212 will develop a voltage across resistor 213. This voltage is applied through diode 214 to the base of transistor 207 turning it on and causing the collector to go to a negative potential. This negative potential is applied to the base of transistor 212 thereby clamping the collector current of transistor 212 at a safe level. In the regulator circuit, capacitor 217 provides the required filtering of voltage $V_1$.

Voltage $V_2$ in the regulator section is obtained through use of an operational amplifier 220 connected in a follower configuration. The operating voltage level $V_2$ is obtained from the voltage divider network consisting of resistors 201, 202 and 203. Without loading the voltage divider network, the operational amplifier 220 takes the voltage developed at the junction of resistors 202 and 203 and reproduces that voltage with ample drive current for those circuits in the tester requiring a $V_2$ supply voltage.

By limiting the energy available for operating the tester to that stored in the capacitor 11, the maximum period of operation of the tester is no more than a few hundred milliseconds. However, a satisfactory test may be conducted within a much smaller time period. In accordance with the present invention, a 100 millisecond time period was found to be acceptable and incorporated into the design of this tester as a 6-cycle timer section. This corresponds to the time period in which 6 cycles of 60 Hz can be generated. At the time of the transfer of the charge on capacitor 11 to the internal circuits of the tester, the timer circuit, consisting of variable resistor 230, resistor 229 and capacitor 232, begins to cause capacitor 232 to charge to the regulated voltage level. Capacitor 232, being in parallel with the series connection of reference diode 233 and resistor 234, only charges up to the level at which the breakdown voltage of diode 233 is exceeded. Once diode 233 turns on, it in turn activates a silicon controlled rectifier (SCR) 235 that discharges capacitor 232. With SCR 235 activated, the base current drive for transistor 212 is shunted through diode 231 and SCR 235 causing transistor 212 to turn off. The output voltage from the regulator then drops to zero. Diode 236 and resistor 237 insure that the capacitor 232 is fully discharged through the SCR 235 at the end of each test cycle.

To obtain the 6 cycles of alternating voltage during the 100 millisecond test cycle, a phase shift oscillator, consisting of operational amplifier 300, three matched capacitors 301, 302 and 303 and resistors 304 and 305, is utilized to generate the low level signal. Varistor 306 and resistor 307 comprise the limiter circuit for the phase shift oscillator. To prevent overshoot of the oscillator as it turns on, bias to the noninverting terminal of the operational amplifier 300 is applied through a time constant circuit, consisting of resistor 308 and capacitor 309, which allows for the gradual turn on of the 60 Hz oscillator. The low level 60 Hz signal from the oscillator is applied through resistors 320, 321 and amplitude control 322 to a power amplifier. Before it is amplified by the power amplifier, capacitor 323 filters out the high frequency components contained in the 60 Hz signal.

Referring to FIG. 3, a power amplifier circuit includes operational amplifiers 330 and 335 and a plurality of transistors 331, 332, 336 and 337. In addition, the power amplifier circuit includes resistors 339, 340, 345 and capacitors 341, 346. These components comprise a feedback network for operational amplifier 330. Finally, resistors 342, 343 and capacitor 344 and as seen in FIG. 2, resistor 347 and capacitor 348, are included in the power amplifier circuit. These components comprise a feedback network of operational amplifier 335. Capacitors 341 and 344 filter out any remaining high frequency components in the 60 Hz signal and reduces the circuit's sensitivity to noise.

The power amplifier operates as follows: When the positive half of the 60 Hz input signal to the amplifier is present on line 93, the output of operational amplifier 330 goes negative turning on transistor 331. At the same time, the input signal to the power amplifier causes the output signal of operational amplifier 335 to go positive turning on transistor 336. Since both transistors 331 and 336 are conducting at this point, current flows from the positive potential $V_1$ on line 91 through transistor 336, the primary of transformer 35, and transistor 331 to the common line 95. When the negative half of the 60 Hz input signal is present on line 93, the output of operational amplifier 330 goes positive turning on transistor 332. At the same time, the input signal to the power amplifier causes the output signal of operational amplifier 335 to go negative turning on transistor 337. Current under this condition flows from the positive potential $V_1$ on lead 91 through transistor 332, the primary of transformer 35, and transistor 337 to the common lead line 95. Thus, the step-up transformer 35 is driven in push-pull fashion by the power amplifier circuit.

The step-up transformer 35 has a fuse 36 in the primary circuit to provide protection against significant over-currents occurring in this current path. The secondary circuit of the transformer 35 also has fuses 37 and 38 to protect against significant over-currents in that current path. Furthermore, the transformer 35 is current-limited internally and will limit a short circuit current to a low value because of the very small diameter wire that is used in constructing the primary and secondary windings. Finally, limiting resistors 375 and 376 in the current path of the secondary of transformer 35 further protect against significant over-currents. Capacitors 377 and 378 bypass small noise spikes occurring on the line that might cause fuses 37 or 38 to open.

In order for the operator of the breakdown tester to know that he is making a valid test and that high voltage has been generated in this system, a high voltage detector 40, which provides a signal when voltage is present, is included in the tester circuitry. A voltage divider circuit consisting of capacitor 401 and resistor 402 provides a voltage which is rectified by diode 403, then applied via line 108 to the gate of SCR 404 shown in FIG. 4. Capacitor 405 filters the rectified voltage produced by diode 403. As seen in FIG. 4, resistor 406 and reference diode 407 form a voltage divider that sets the voltage on the cathode of SCR 404. In parallel with resistor 406 is the series combination of current-limiting resistor 408, an optical isolator gate 45 and the SCR 404.

As the voltage produced by diode 403 and capacitor 405 increases on the gate of SCR 404, the voltage point is reached at which the SCR 404 switches to the on state. Current then flows from voltage $V_1$ on line 102 through resistor 408, the optical isolator gate 45, SCR 404 and reference diode 407 to line 107. Once SCR 404 turns on, the optical isolator gate 45, which couples the signal from the internal electronics of the breakdown tester to the external system electronics, produces a logic pulse that sets a pass register 50, comprising NAND gates 501 and 502, into a high state. The logic high state exists on NAND gate 501 and is coupled through one of the two inputs of AND gate 560 and resistor 603 to the base of transistor 605. The pass indicator light 602 will be turned on, indicating a valid test if a logic high state also exists on the remaining input of AND gate 560. If, however, excessive current is sensed in the device under test as will be explained later, the logic high state produced by NAND gate 551 will be removed from AND gate 560 preventing the pass indicator lamp from illuminating.

In the use of this tester to test electrical devices, some of these devices will undoubtedly have very low current leakage values, yet could still be considered an electrical hazard. In an effort to discover these devices and in accordance with the present invention, a current detector section 70 is designed to respond to a peak current of 700 milliamperes which occurs for as little as 70 nanoseconds. As seen in FIG. 3 a diode array 700 in the current detector section detects both positive and negative-going current of the 60 Hz high voltage test signal. This current is applied to sensing resistor 701 where a voltage is developed in direct proportion to the amplitude of the current in the diode array 700. Resistor 702 and reference diode 703 combine to establish a reference threshold voltage on resistor 704. If either polarity of the current through diode array 700 exceeds this reference voltage, current will flow through resistor 704 increasing the voltage drop sufficiently to turn on transistor 705. Capacitor 706 in parallel with resistor 704 bypasses the very high frequencies on this line that could cause false triggering of the current detector 70, and resistor 707 connects the collector of transistor 705 to the $V_1$ voltage on lines 91 and 102.

The persistence of transistor 705 in the on state is only that of the current exceeding the threshold level in the current detector circuit. In order to avoid the possibility of having inadequate turn on of other logic circuits that respond to the excessive current signal, a monostable multivibrator 710 with a pulse duration time of 1 millisecond is inserted between transistor 705 and these logic circuits, although it is understood that any circuit providing a pulse width of a suitable duration could be utilized. The excessive current signal from the collector of transistor 705 is applied via line 103 through capacitor 708 seen, in FIG. 4, to the monostable multivibrator 710 also seen in FIG. 4. The multivibrator 710 has associated resistors 711 and 712 and capacitors 713 and 714 which it uses to produce the 1 millisecond pulse.

Part of the quick shutdown circuitry 90 is designed to respond to one excessive current signal occurring in one half cycle of the 60 Hz signal. This circuitry utilizes SCRs 900 and 901 shown in FIG. 3 to shutdown the power amplifier when the excessive current signal is detected. The 1 millisecond pulse from multivibrator 710 in FIG. 4 is applied on line 101 through resistor 902 and diodes 903 and 904 onto the gates of SCRs 900 and 901 in FIG. 3. The polarity of the 60 Hz half cycle that is across the parallel but reversed SCRs will determine which SCR will turn on and terminate the remainder of that half cycle, protecting the circuitry within the tester. At what would otherwise be the end of the 60 Hz half cycle, the SCR that is conducting shuts off and the test cycle continues from that point.

The output of the monostable multivibrator 710 shown in FIG. 4 is also applied through diode 711 and resistor 712 to the gate of transistor 910 which, along with capacitors 911 and 912 and resistors 913 and 914, comprise an analog counter in the quick shutdown circuitry 90. Capacitor 911 is charged only partially during the first 1 millisecond pulse from the multivibrator 710 which corresponds to an excessive current signal occurring in a half cycle of the 60 Hz signal. If on the consecutive half cycle or any other portion of the 6 cycle test signal, another over-current detection occurs, the sequence will be repeated and the second millisecond pulse from the multivibrator 710 charges capacitor 911 to a potential that turns on transistor 910.

The pulse produced by transistor 910 is applied to the gate of an SCR 915 which begins to conduct and discharges the remaining energy stored on capacitor 11 shown in FIG. 2. In the conducting state, SCR 915 provides a low resistance path for voltage $V_1$ on line 101 to flow first through resistor 916, then through SCR 915 and on to line 105, the common line in the circuit. Another discharge path is provided for SCR 915 that is from voltage $V_1$ on line 101, through an optical isolator gate 47, and resistor 917, then through SCR 915 to line 105. This second discharge path causes a logic pulse to be generated in the optical isolator gate 47 coincident with the discharge of capacitor 11 in FIG. 2. The output of the optical isolator gate 47 sets a fail register 55, comprising NAND gates 551 and 552, into a high state. At the same time, the output of AND gate 560 is caused to go to a low state. The result is that the fail indicator light 601 will illuminate while holding the pass indicator light 602 off. The resistors 603, 604, the transistors 605, 606, and the status indicating lamps 601, 602 are conventional representations of an illuminating circuit and are shown for illustrative purposes only since equivalent circuits are known in the art.

For subsequent tests or retesting of electrical devices, before each test can be initiated, a reset switch 608 must be activated to reset the pass register 50 and the fail register 55. Resetting of the registers is accomplished by reducing the positive potential applied through resistor 609 to one side of NAND gates 502 and 551 to a logical zero state clearing each register of any previous information that is contained therein.

Various modifications of this invention are contemplated and may obviously be resorted to by those skilled in the art without departing from the spirit and scope of the invention as hereinafter defined by the appended claims.

What is claimed is:
1. An apparatus for voltage breakdown testing of insulation within an electrical device comprising:
 circuit means for providing a test voltage for application to the insulation during a test period;
 energy storage means only supplying a predetermined nonlethal fixed amount of energy to the circuit means for the test period, the energy input into the circuit means, part of which is used as operating power for the circuit means and part of which is used to develop the test voltage, being limited to an energy level stored within the energy storage means;
 a power source for charging the energy storage means to the fixed energy level; and
 means for switching the energy storage means from the power source to the circuit means to cause the energy storage means to supply steady-state direct-current power to the circuit means for the test period, the circuit means being activated only dur- ing the test period and the energy storage means being discharged during the test period.

2. An apparatus as described in claim 1 wherein the energy storage means comprises a capacitor.

3. An apparatus as described in claim 1 further comprising current detector means for sensing a level of electrical current flowing in an electrical device under test when power from the energy storage means is supplied to the circuit means.

4. The apparatus as described in claim 3 further comprising means for providing a quick shutdown of the circuit means when the level of the electrical current flowing into the electrical device under test is greater than a predetermined value to thereby inhibit the further application of the test voltage.

5. The apparatus as described in claim 4 further comprising voltage detector means for sensing the presence of the test voltage applied to the electrical device under test when power from the energy storage means is supplied to the circuit means.

6. The apparatus as described in claim 5 further comprising means to provide a fail output if the level of electrical current flowing into the electrical device under test is greater than a predetermined value, and the voltage detector means senses the presence of the test voltage that is applied to the electrical device under test.

7. The apparatus as described in claim 6 further comprising means to provide a pass output when the voltage detector means senses the presence of the test voltage that is applied to the electrical device under test, and the level of electrical current flowing into the electrical device under test is less than a predetermined value.

8. An apparatus as described in claim 1 further comprising a timer circuit for limiting the maximum period during which the test voltage is generated.

9. An apparatus for voltage breakdown testing of insulation within an electrical device comprising:
circuit means for providing a test voltage for a test period, the circuit means including a regulator and timer means operative for providing a plurality of regulated direct-current voltages for a limited time period, an oscillator and amplifier means operative in response to the application of the plurality of direct-current voltages for causing the oscillator to provide a sinusoidal signal and the amplifier means operatively associated with a transformer for establishing the test voltage from the sinusoidal signal;
energy storage means for only supplying a predetermined nonlethal fixed amount of energy to the circuit means for operation of the circuit means and for developing the test voltage for the test period, the energy input into the circuit means being limited to an energy level stored within the energy storage means;
a power source for charging the energy storage means to the fixed energy level; and
means for switching the energy storage means from the power source to the circuit means to cause the energy storage means to supply steady-state direct-current power to the circuit means for the test period, the circuit means being activated only during the test period and the energy storage means being discharged during the test period;
a timer circuit for limiting the maximum period over which the test voltage is generated;
means for sensing a level of electrical current flowing in an electrical device under test when power from the energy storage means is supplied to the circuit means;
means for providing a quick shutdown of the circuit means when the level of electrical current flowing into the electrical device under test is greater than a predetermined value to thereby inhibit the further application of the test voltage; and
indicator means adapted to provide an indication of the result of a voltage breakdown test.

10. An apparatus for voltage breakdown testing for insulation within an electrical device comprising:
a series of system elements used for producing a test voltage applied to the insulation of the electrical device;
a power source for supplying energy to a first of the series of system elements, the first system element being supplied only with a nonlethal amount of energy;
a switching means for connecting the first system element to the power source for charging the first system element;
a plurality of other of the series of system elements obtaining steady-state direct-current power from the first of the series of system elements for operation of the other system elements and to generate the test voltage for a test period wherein each of the other system elements must be operable in order to obtain the test voltage for the test period at the output of a last of the series of system elements, and wherein each of the other system elements dissipates a portion of the energy available from the first system element. the test voltage being produced while the switching means is electrically isolating the system elements from the power source.

11. An apparatus for voltage breakdown testing of insulation within an electrical device, the apparatus comprising:
a test circuit for generating a test voltage for a test period, the test circuit being activated only during the test period;
a power source for supplying energy to the test circuit wherein the test voltage is generated for the test period;
means responsive to the test circuit for providing an indication of the result of a voltage breakdown test;
a switching means that isolates the test circuit from the power source during the test period;
optical isolators disposed between the test circuitry and the indication means for electrical isolation and for coupling a signal indicative of the result of the voltage breakdown test from the test circuit to the indication means, the test voltage being confined to the test circuit and electrical device, and wherein the isolation provided by the switching means and optical isolators completely isolates the test circuit and the electrical device from the power source and the indication means during the test period.

12. The apparatus as described in claim 11 further comprising energy storage means for only supplying a predetermined nonlethal fixed amount of energy to the test circuit for the test period, the energy input into the test circuit being limited to an energy level stored within the energy storage means.

13. The apparatus as described in claim 12 wherein the switching means provide a charge path between the energy storage means and the power source for charging the energy storage means to the predetermined energy level, a discharge path between the energy storage means and the test circuit to cause the energy storage means to supply steady-state direct-current power to the test circuit, and means responsive to a start signal that causes the switching means to disconnect the charge path between the energy storage means and the power source, and connect the discharge path between the energy storage means and the test circuit.

14. The apparatus as described in claim 12 wherein the energy storage means includes a single capacitor.

15. The apparatus as described in claim 11 wherein the test circuit includes a regulator and timer means operative for providing a plurality of regulated direct-current voltages for a limited time period, an oscillator and amplifier means operative in response to the application of the plurality of direct-current voltages for causing the oscillator to provide a sinusoidal signal, and the amplifier means operatively associated with a transformer for establishing the test voltage from the sinusoidal signal.

* * * * *